United States Patent [19]

Ochii

[11] Patent Number: 5,557,566
[45] Date of Patent: Sep. 17, 1996

[54] SEMICONDUCTOR NONVOLATILE RAM HAVING E2PROM WITH A FLOATING GATE LOCATED ABOVE THE MIDPORTION OF THE TRANSISTOR CHANNEL

[75] Inventor: Kiyofumi Ochii, Yokohama, Japan

[73] Assignee: Kabushiki Kaisha Toshiba, Kawasaki, Japan

[21] Appl. No.: 376,644

[22] Filed: Jan. 20, 1995

Related U.S. Application Data

[63] Continuation of Ser. No. 858,609, Mar. 27, 1992, abandoned.

[30] Foreign Application Priority Data

Mar. 30, 1991 [JP] Japan ............................... 3-093654

[51] Int. Cl.$^6$ ........................................... G11C 14/00
[52] U.S. Cl. ................ 365/185.08; 365/228; 257/298; 257/306; 257/316; 257/321
[58] Field of Search ....................... 365/185, 228, 365/185.08; 257/298, 306, 316, 321, 322

[56] References Cited

U.S. PATENT DOCUMENTS

| | | | |
|---|---|---|---|
| 4,998,220 | 3/1991 | Eitan et al. ........................... | 365/51 |
| 5,063,425 | 11/1991 | Yamauchi et al. ...................... | 257/298 |
| 5,065,201 | 11/1991 | Yamauchi ............................. | 365/185 |
| 5,251,171 | 10/1993 | Yamauchi ............................. | 365/185 |

OTHER PUBLICATIONS

A Novel NVRAM Cell Technology for High Density Applications, Yamauchi et al., IEDM 88, pp. 416–419.
A Versatile Stacked Storage Capacitor On Flotox Cell For Megabit NVRAM Applications, Yamauchi et al., IEDM 89, pp. 595–598.

*Primary Examiner*—David C. Nelms
*Assistant Examiner*—Andrew Q. Tran
*Attorney, Agent, or Firm*—Finnegan, Henderson, Farabow, Garrett & Dunner, L.L.P.

[57] ABSTRACT

A semiconductor nonvolatile RAM having a dynamic RAM cell and an E$^2$PROM cell. The dynamic RAM cell includes a first transistor having a current path having one end connected to a bit line and a gate connected to a word line. A storage region is connected to another end of the current path. The E$^2$PROM cell includes a second transistor including a source region, a drain region, a channel region having first and second parts between the source and drain regions, a floating gate above the first part of the channel region and the source region, and a control gate. The drain of the second transistor is connected to the another end of the current path of the first transistor. Another end of the storage region is above the second part of the channel region and the floating gate. The channel region of the second transistor is rendered conductive in accordance with data stored in the storage region of the dynamic RAM cell.

8 Claims, 6 Drawing Sheets

SEMICONDUCTOR NONVOLATILE RAM HAVING E2PROM WITH A FLOATING GATE LOCATED ABOVE THE MIDPORTION OF THE TRANSISTOR CHANNEL

This application is a continuation of application Ser. No. 07/858,609, filed Mar. 27, 1992, now abandoned.

BACKGROUND OF THE INVENTION

1. Field of the Invention

The present invention relates to a semiconductor nonvolatile RAM, and, more specifically, to a chip on which both a DRAM (dynamic random access memory) as a RAM (random access memory), and an $E^2PROM$ (electrical erasable read only memory) as a nonvolatile memory are arranged.

2. Description of the Related Art

FIG. 12 is a diagram showing a cross section of a conventional nonvolatile RAM in which a DRAM cell and an $E^2PROM$ cell are mixedly arranged, and FIG. 13 shows an equivalent circuit of this conventional RAM.

A transistor T1, which is turned ON/OFF by a potential of a select gate SG corresponding to a word line, serves to selectively connect a drain D ($n^+$) corresponding to a bit line and a memory node NP of the DRAM cell with each other. A transistor T2 serves to connect the transistor T1 and a transistor T3, which is a part of the $E^2PROM$ cell, together.

A capacitor of the DRAM cell includes a memory node NP connected to a source of the transistor T1, and a control gate CG. The control gate CG serves as a plate electrode, and is controlled by means of a pulse in a store mode for transferring data from the DRAM cell to the $E^2PROM$ cell, and in the recall mode for transferring data from the $E^2PROM$ cell to the DRAM cell.

A nonvolatile RAM having the above-described structure, when operated as a regular DRAM, serves as a stack-type cell. In other words, both a recall gate RG and the control gate CG of the transistor T2 are grounded so that the control gate CG serve as a plate electrode, and the storage capacitor of the DRAM is the capacity between the control gate CG and the memory node NP. Since the recall gate RG is ground, the DRAM and $E^2PROM$ cells are separated from each other. The basic operation of the DRAM, including writing, reading-out, refreshing, etc. is the same as that of regular DRAM cells.

The following is an explanation of the operation of the store mode for transferring data stored in the DRAM cell to the $E^2PROM$ cell.

As can be seen in FIG. 14, the operation of the store mode can be divided into two, the first half and the last half.

The first half of the operation is an erasing process which writes the data of the DRAM cell, which stores data "0", in the $E^2PROM$ cell. Electrons are emitted from the floating gate FG of the corresponding $E^2PROM$ cell. As shown in the FIG. 14, the control gate CG and the source S are biased to the potentials of the ground and the power source Vp, respectively. Between the control gate CG and the source S, provided are the memory node NP serving as a floating node and the floating gate FG, which are capacitive-coupled with each other between the ground potential and the power source Vp.

When data "0" is stored in the DRAM cell, the memory capacitor between the control gate CG and the memory node NP is not charged, whereas when data "1" is stored therein, the storage capacitor is charged with "+" electrical charges. Consequently, while the control gate CG and the source S are biassed to the ground potential and the power source voltage Vp, respectively, a weak electrical field is applied onto the thin tunnel oxidation film located between the floating gate FG and the source S in the $E^2PROM$ cell, when data "1" is stored in the DRAM cell. In contrast, under the same condition, the intensity of the electrical filed applied to the thin tunnel oxidation film in the DRAM cell, when data "0" is stored, is high. Therefore, only in the latter case, an F-N (Fowler-Nordheim) current flows in the $E^2PROM$, and electrons are discharged from the floating gate FG.

The last half of the store mode is a programming process in which electrons are injected to the floating gate of the $E^2PROM$ cell so as to write data of the DRAM cell storing data "1" into the $E^2PROM$. As can be understood from FIG. 14, the control gate CG and the source S are biassed to the power source voltage Vp and the ground potential, respectively, and therefore the electrical field applied onto the tunnel oxidation film provided between the floating gate FG and the source S is weak in the case of DRAM "0" and strong in the case of DRAM "1". Thus, only in the latter case, an F-N current flows through the $E^2PROM$ cell in the direction opposite to that of the erasing process, and electrons are injected to the floating gate FG for programming.

The following is an explanation of the recall mode for transferring data stored in the $E^2PROM$ cell to the DRAM cell with reference to FIG. 15.

First, a drain D=5V and a select gate SG=8V are set, and data "1" is written in every DRAM cell. Then, a recall gate RG is set to 8V. At the recall gate RG=8V, the threshold level of the transistor in the $E^2PROM$, when data "0" is stored therein, is low, and therefore the transistor is set in a depletion mode, whereas that of the $E^2PROM$, when data "1" is stored therein, is high, and therefore the transistor is set in an enhance mode. Accordingly, electrical charges accumulated in the DRAM cell connected to the $E^2PROM$ cell, when data "0" is stored therein, are discharged to the source terminal of the $E^2PROM$ through the transistors T2 and T3, turned on by the recall gate RG. In contrast, charges in the DRAM cell connected to the $E^2PROM$ cell, when data "1" is stored therein, remain in the DRAM cell without being discharged. Consequently, data stored in the $E^2PROM$ is thus transferred to the DRAM cell.

In the meantime, conventional nonvolatile RAM cells are those which consist of DRAM cells and $E^2PROM$ cells effectively mixed thereon. However, these cells have a structure in which three transistors T1, T2, and T3 are arranged in the same plane, as can be seen in FIG. 12. As a result, the occupied area in a cell is significantly larger than that of a regular DRAM or $E^2PROM$.

SUMMARY OF THE INVENTION

The present invention has been proposed in consideration of the above problem, and the object thereof is to provide a semiconductor nonvolatile RAM in which a DRAM cell and an $E^2PROM$ cell are effectively arranged, and the occupied area is about the same as that of a regular DRAM cell or an $E^2PROM$ cell.

The object of the invention can be achieved by:

a semiconductor nonvolatile RAM comprising:

a dynamic RAM cell having a first transistor one end of a current path of which is connected to a bit line, and a gate of which is connected to a word line, and a storage region connected to an other end of the current path of the first transistor, for storing data; and an E²PROM cell having a second transistor including a floating gate and a control gate, one end of a current path of the second transistor including a channel region connected to the other end of said first transistor, a part of said channel region of said second transistor is rendered conductive in accordance with data stored in the storage region of the dynamic RAM cell.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will now be explained in detail with reference to accompanying drawings.

Figure 1:
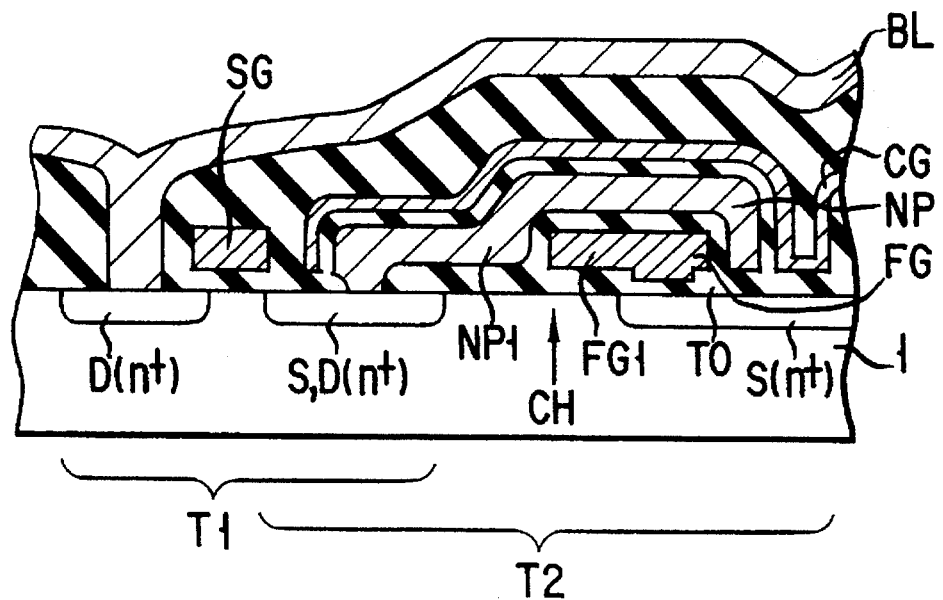
FIG. 1 is a side cross section of the first embodiment of the present invention.
Figure 2:
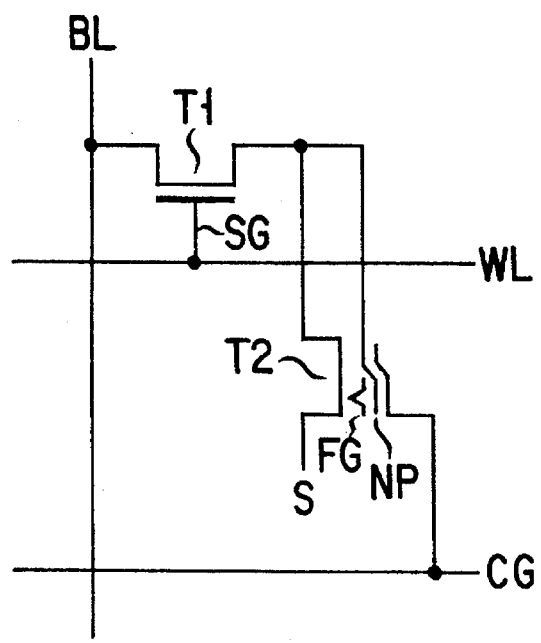
FIG. 2 is a diagram showing an circuit equivalent to the embodiment shown in FIG. 1.

FIG. 1 is a cross section of a structure of the present invention, and FIG. 2 is a circuit diagram equivalent to the structure shown in FIG. 1. In FIGS. 1 and 2, the same items are designated by the same numerals.

Inside a semiconductor substrate 1, an n⁺ diffusion layer serving as a drain D and source S, constituting an access transistor T1 of a DRAM cell, and another n⁺ diffusion layer serving as a source, which is a part of transistor T2 of an E²PROM cell, are arranged a predetermined distance away from each other. The n⁺ diffusion layer serving as the source of the transistor T1, a part of the DRAM cell, also plays the role of a drain D of the transistor T2 constituting the E²PROM cell.

A select gate SG of the access transistor T1 is provided above the semiconductor substrate 1 such as to be insulated therefrom, and this select gate SG is connected to a word line WL as shown in FIG. 2. Meanwhile, the drain D of the access transistor T1 is connected to a bit line BL. Further, a storage capacitor of the access transistor T1 is formed of a storage node NP connected to the source S of the transistor T1, and a control gate CG provided as a plate electrode above the storage node NP such as to be insulated therefrom.

In the E²PROM cell, there is provided a thin tunnel oxidation film TO on the source S of the transistor T2, and a floating gate FG on this tunnel oxidation film TO. On this floating gate FG, is an insulating layer, on which the storage node NP of the DRAM cell is further provided. On this storage node NP, is another insulating layer, on which the control gate CG is further formed. On this control gate CG, is another insulating layer, on which the above-mentioned bit line BL is formed.

In the meantime, a part of the above-mentioned floating gate FG projects out above the mid portion between the source and drain of the transistor T2. The storage node NP includes a gate portion NP1 which does not overlap the floating gate FG and acts as a gate of the transistor 2. This gate portion NP1 is located above the mid-portion of the source and drain of the transistor T2, and the distance from the surface of the semiconductor substrate 1 to the gate portion NP1 is the same as the length of the projecting portion FG1 of the floating gate FG. Between the gate portion NP1 and the semiconductor substrate 1, and between the projecting portion FG1 of the floating gate FG and the semiconductor substrate 1, are insulating layers. With a channel CH provided between the source and drain of the transistor T2, the portion controlled by the projecting portion FG1 of the floating gate FG, and the portion controlled by the gate portion NP1 of the storage node NP, can be continuously formed in a self-aligned manner. Consequently, a coupling capacitor between the floating gate FG and the storage node NP can be made large, and the occupied area in the cell can be reduced at the same time.

Figure 4A:
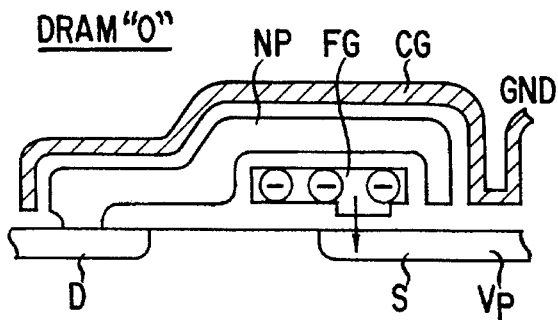
Figure 4B:
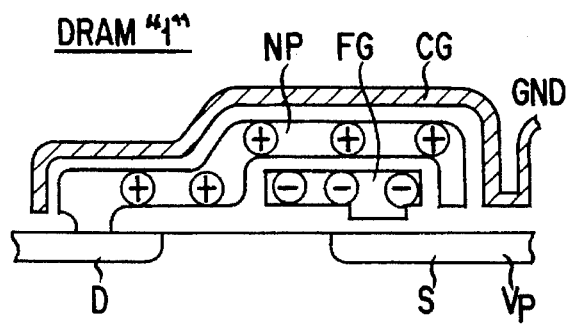
Figure 5:
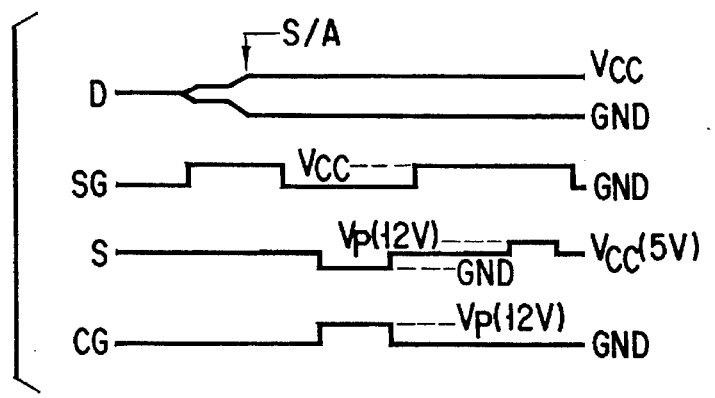
FIG. 5 is a diagram showing waveforms during the erasing and programming operations.

The following is an explanation of the operation of the cell having the above-described structure with reference to FIGS. 3 through 5.

As mentioned before, the operation of a nonvolatile RAM is divided into three modes, i.e. a store mode for writing data stored in the DRAM cell to the E²PROM cell by transfer, a recall mode for transferring data stored in the E²PROM cell to the DRAM cell, and a regular operation as a DRAM.

Transfer of data stored in the DRAM cell to the E²PROM cell is in fact an erasing operation in which electrons are emitted from the floating gate of the E²PROM cell in accordance with data "1" or "0" stored in the DRAM cell, or a programming operation in which electrons are injected into the floating gate FG. In the cell according to an embodiment of the present invention, data stored in the DRAM cell is transferred to the E²PROM by the following operation.

First, data stored in the DRAM cell is read out to a bit line BL. In other words, the bit line BL is initialized to the initial voltage, and a group of cells is selected by a select gate SG. Thus, a small signal is read out to the bit line from the selected cell. This read out small signal is amplified by a sense-amplifier, which is not shown.

Figure 3A:
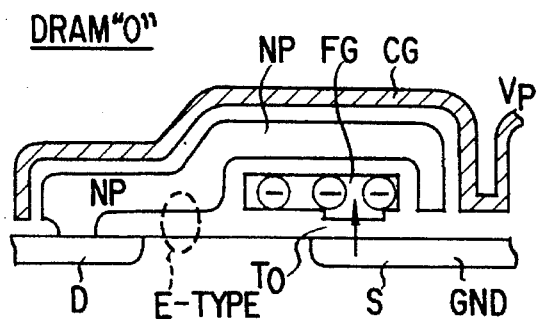
FIGS. 3A, 3B, 4A, and 4B are diagrams illustrating erasing and programming operations of the cell shown in FIGS. 1 and 2.

After that, the select gate SG is closed, and the control gate is set to a high potential, for example, 12V (this high potential will be called Vp hereinafter). The source S of the transistor T2, which has been maintained at a power source voltage Vcc (5V) up until then, is lowered to a ground potential. Such a status is illustrated in FIG. 3A. In this status, the control gate CG is set to the high potential Vp; therefore the potential of the storage node NP which is capacity-coupled with the control gate CG is also raised, and so is the potential of the floating gate FG capacity-coupled with the memory node NP.

Figure 3B:
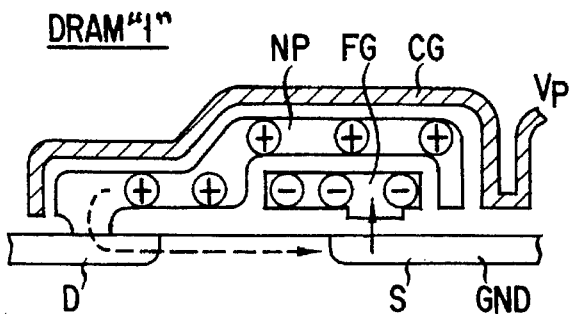

On the other hand, since the source S of the transistor T2 is grounded, an electrical field is created in the tunnel oxidation film TO in the direction of injection of electrons from the source S to the floating gate FG. It should be noted here that in the case where data "0" is stored, i.e. no charges are accumulated in the storage node NP, electrons are injected into the floating gate FG in advance as can be seen in FIG. 3A. Accordingly, in the case where data "1" is stored in the cell as shown in FIG. 3B, the electrical field acting on the tunnel oxidation film TO is further intensified, compared to the case where data "0" is stored. However, the transistor T2 of the $E^2$PROM cell is turned on so as to discharge the charges accumulated in the storage node NP to the source S as indicated by broken lines. Thus, as in the case where data "0" is stored in the $E^2$PROM cell, electrons are injected to the floating gate FG. That is, at the initial stage of the store mode, regardless of data "1" or "0" stored in the DRAM cell, electrons are injected to the floating gate FG, and thus programming is carried out.

Next, the data read out to the bit line BL from the DRAM cell is written back to the DRAM cell. Consequently, electrons are erased from only cells in which data "0" is stored. More specifically, as shown in FIG. 5, after setting the source S of the transistor T2 and the control gate CG back to the potential Vcc and the ground potential GND, respectively, the select gate SG is opened. In other words, the data read out to the bit line BL from the DRAM cell is written back to the DRAM cell. Then, the source S of the transistor T2 is set to a high voltage Vp so as to apply a strong electrical field in the electron-emitting direction onto the tunnel oxidation film TO of the $E^2$PROM cell in which no charges are accumulated in the storage node NP, i.e. data "0" is stored, as shown in FIG. 4A. Further, as can be seen in FIG. 4B, in the DRAM cell in which data "1" is stored, positive charges are accumulated between the storage node NP and the control gate CG; therefore an electrical field acting on the tunnel oxidation film TO is so weak that no electrons are emitted. Here, in the cell in which data "0" is stored, since the channel portion having the gate portion NP1 of the storage node NP as its gate is cut off, no electrons flow from the source S to which the high potential Vp is applied, to the storage node NP. Eventually, in the cell storing data "0", since no electrons are caught in the floating gate FG, the threshold level of the transistor T2 of the $E^2$PROM cell becomes low, whereas in the cell storing data "1", since electrons are caught in the floating gate FG, the threshold level of the transistor T2 becomes high.

It should be noted that the operation for blocking the flow of charges from the source S to which the high potential Vp is applied, to the storage node by cutting off channel portion corresponding to the gate portion NP1 of the storage node NP in the cell storing data "0" is similar to the case where a DRAM cell and an $E^2$PROM cell are separated from each other without being influenced by the $E^2$PROM cell during the regular operation of a DRAM. The regular operation of a DRAM will be later described.

Figure 6:
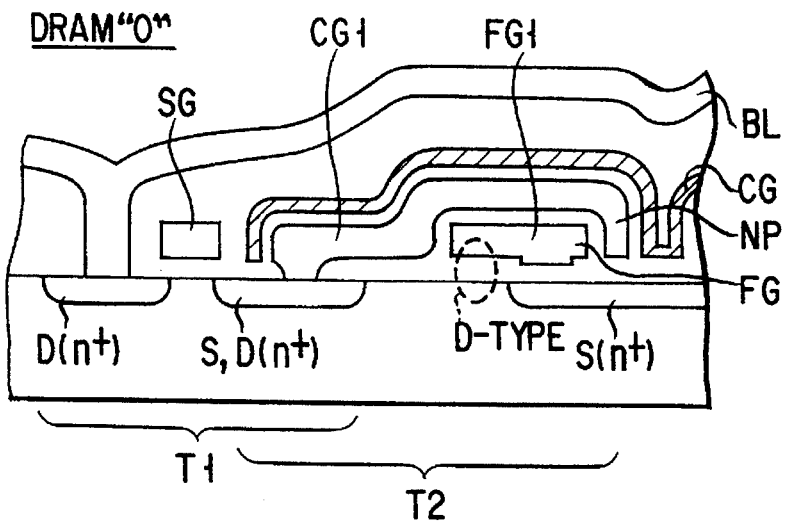
FIGS. 6 and 7 are diagrams illustrating both DRAM "0" and DRAM "1" cases of recall operations of the cell shown in FIGS. 1 or 2.
Figure 7:
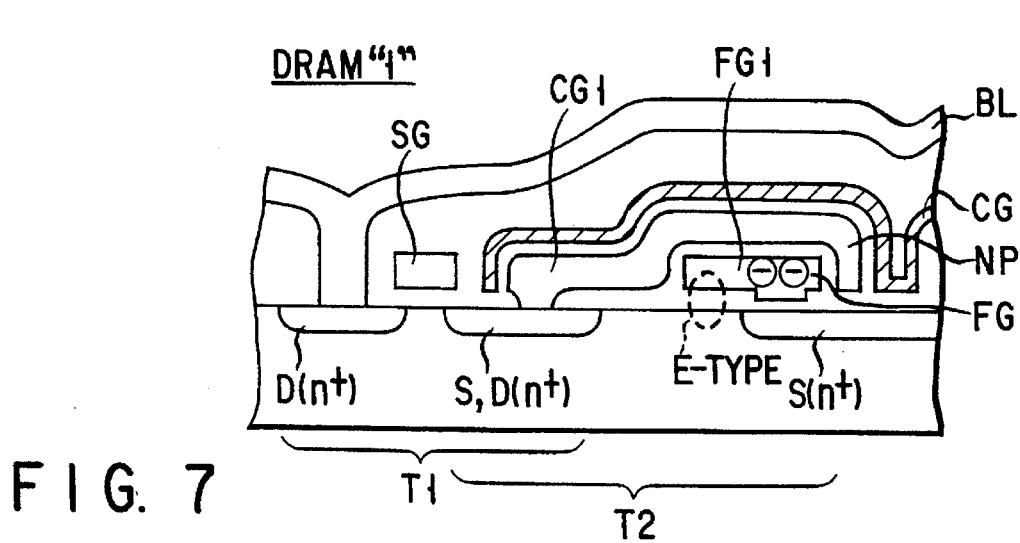
Figure 8:
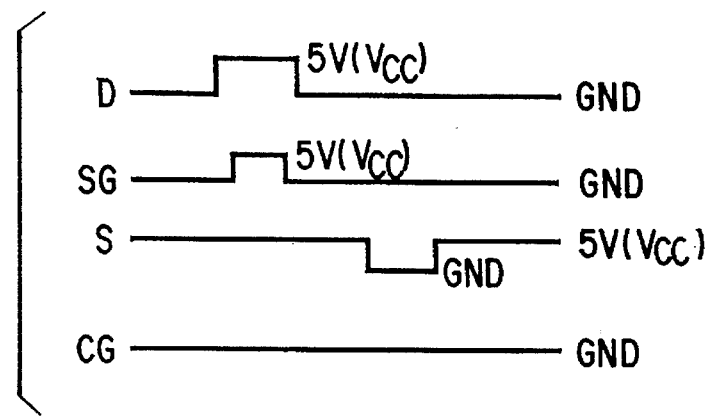
FIG. 8 is a diagram showing waveforms during the recall operations of the cell shown in FIGS. 1 or 2.

The following is an explanation of the operation of the recall mode for transferring data stored in an $E^2$PROM cell to a DRAM cell with reference to FIGS. 6 through 8.

First, the drain D (bit line BL) of the transistor T1, and the select gate SG are set to the potential Vcc, and a group of DRAM cells are selected. Data "1" is written to all the DRAM cells selected. Then, the drain D of the transistor T1 and the select gate SG are set back to the ground potential. In this state, the source S of the transistor T2 is lowered to the ground potential, and only the transistor T2, which is of a depletion type, is turned on since no electrons are caught in the floating gate FG and the threshold level thereof is lowered. Consequently, as shown in FIG. 6, in only the cells storing date "0", positive charges accumulated in the storage node NP of the DRAM cell are discharged to the source S of the transistor T2 via the drain D and channel region CH, thereby switching data stored in the DRAM cell into "0".

Further, as can be seen in FIG. 7, in the cells storing data "1", positive charges accumulated in the storage node NP of the DRAM cell are not discharged, thereby maintaining data "1" stored in the DRAM cell as it is. In other words, data is transferred from the $E^2$PROM cell to the DRAM cell. After that, the source S of the transistor T2 is set to the potential Vcc, thereby electrically separating the $E^2$PROM cell and the DRAM cell from each other.

Figure 9:
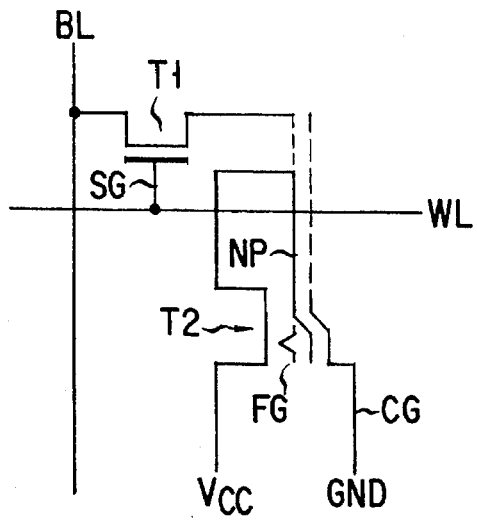
FIG. 9 is a diagram of an equivalent circuit of the cell showing in FIGS. 1 or 2, designed to explain the function thereof as a DRAM.

The following is an explanation of the regular operation of a DRAM with reference to FIG. 9.

As shown in this figure, by setting the source S of the transistor T2 to the potential Vcc, the DRAM cell and the $E^2$PROM cell are electrically separated from each other regardless of whatever the data stored in the DRAM cell or in the $E^2$PROM cell is.

Figure 10:
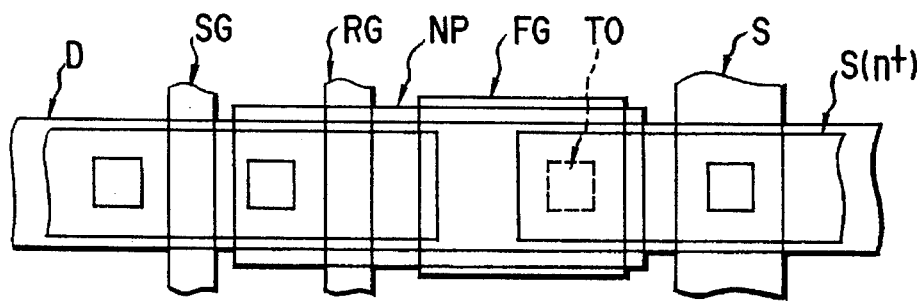
FIG. 10 is a pattern plan view of the main portion of a conventional semiconductor nonvolatile RAM.
Figure 11:
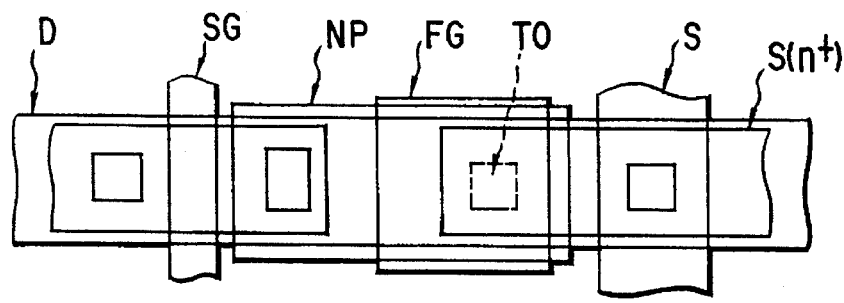
FIG. 11 is a pattern plan view of the main portion of a semiconductor nonvolatile RAM according to the present invention.
Figure 12:
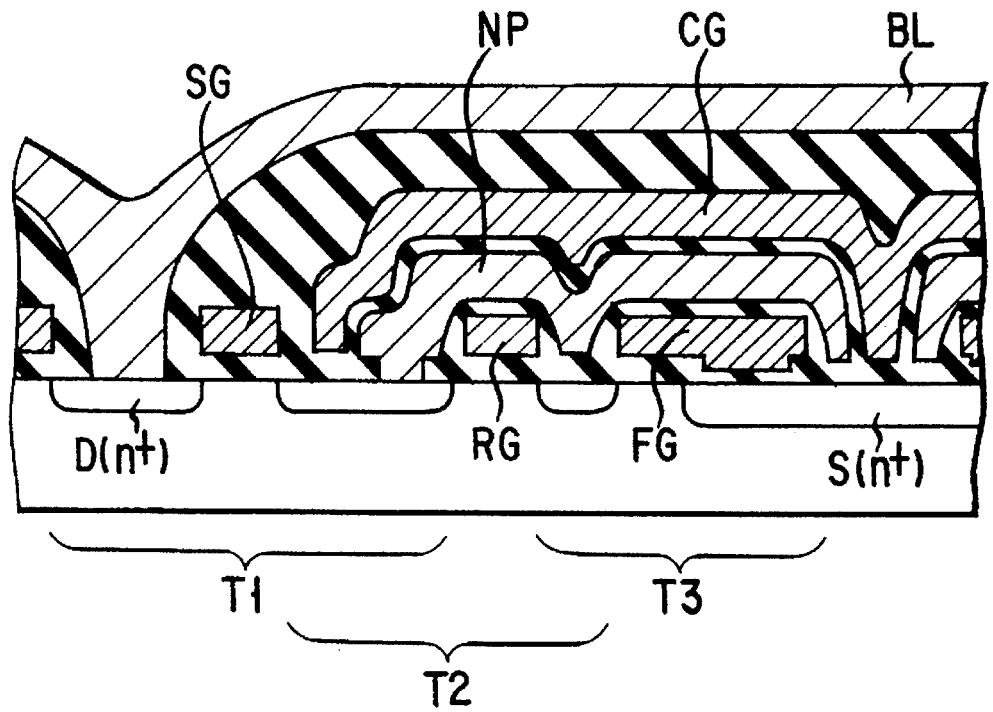
FIG. 12 is a side cross section of a conventional semiconductor nonvolatile RAM.
Figure 13:
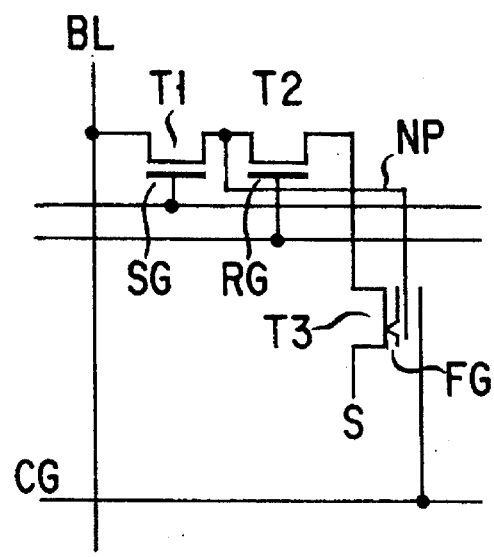
FIG. 13 is a diagram showing a circuit equivalent to the conventional RAM shown in FIG. 12.
Figure 14:
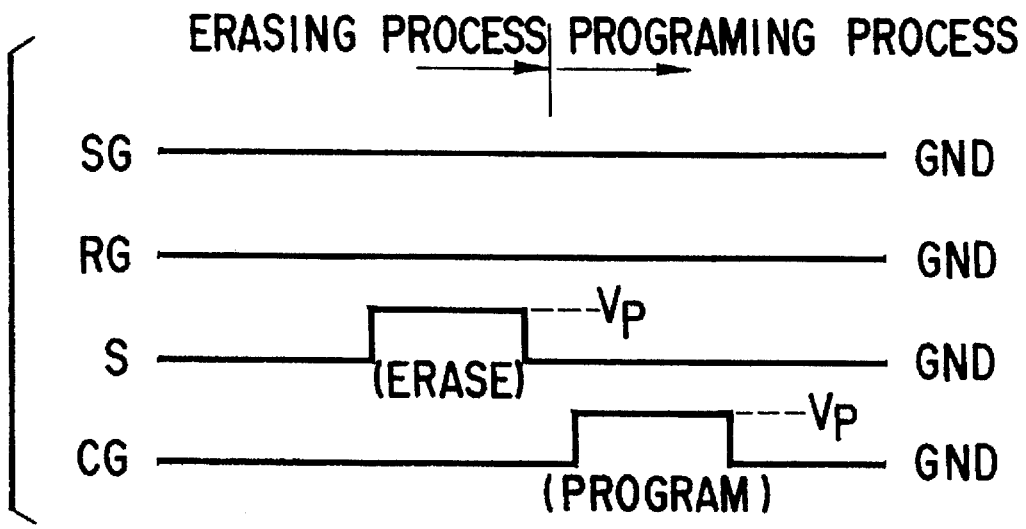
FIG. 14 is a diagram showing waveforms during erasing and programming operations of the RAM shown in FIGS. 12 or 13.
Figure 15:
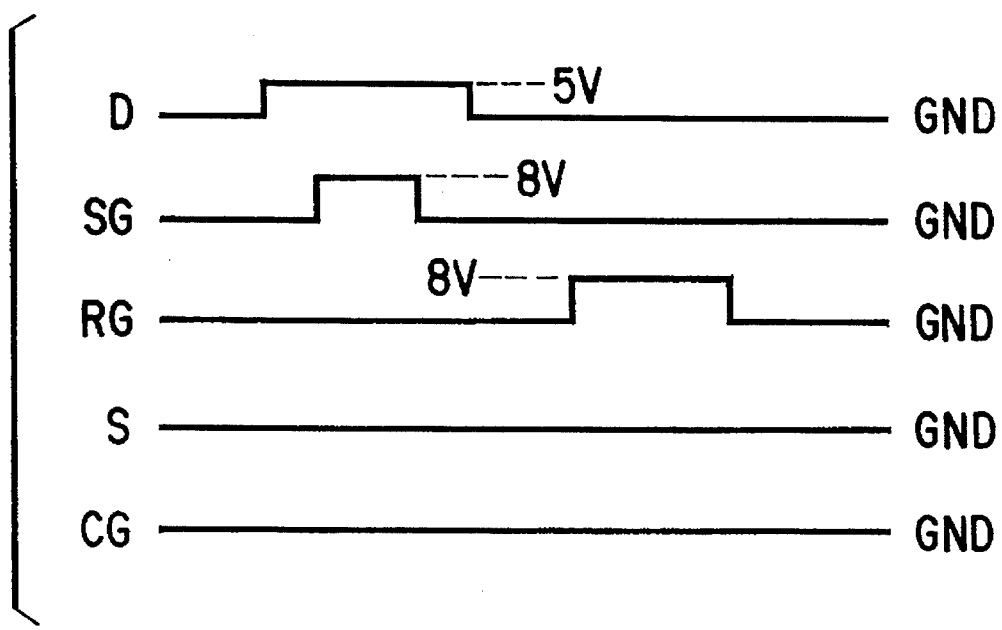
FIG. 15 is a diagram showing waveforms to explain recall operations of the RAM shown in FIGS. 12 or 13.

FIG. 10 is a plan view of a conventional nonvolatile RAM cell, whereas FIG. 11 is a plan view of a nonvolatile RAM cell according to the present embodiment. In neither FIG. 10 nor FIG. 11 is the control gate CG is not shown.

According to the embodiment, the recall gate RG, which is necessary in the conventional technique, can be removed. Further, the channel portion controlled by the projecting portion FG1 of the floating gate FG of the transistor T2 constituting the $E^2$PROM, and the channel portion controlled by the gate portion NP1 of the storage node NP can be formed in a self-aligned manner. Consequently, the occupied area in a cell can be reduced to about 87% of the conventional ones, thereby enhancing the degree of integration compared to the conventional techniques.

Lastly, it should be pointed out that the present invention is not limited to the embodiment described above, and can be remodeled into various types of cells as long as the essence of the present invention is preserved.

What is claimed is:

1. A semiconductor nonvolatile RAM comprising:
   a dynamic RAM cell comprising a first transistor having a current path having one end connected to a bit line, a gate connected to a word line, and a storage region having one end connected to another end of said current path, for storing data; and
   an $E^2$PROM cell comprising a second transistor including a source region, a drain region, a channel region having first and second parts between said source and drain regions, a floating gate above said first part of said channel region and said source region, and a control gate, said drain region of said second transistor being connected to said another end of said current path of said first transistor, and another end of said storage region having first and second parts, said first part of said storage region being above said second part of said channel region and said second part of said storage region being above said floating gate, wherein said second part of said channel region is rendered conductive when one logic data is stored in said storage region, and said second part of said channel region is rendered nonconductive when other logic data is stored in said storage region.

2. A semiconductor nonvolatile RAM according to claim 1, wherein the second part of said channel region and said first part of said storage region are arranged in a self-aligned manner with the first part of said channel region.

3. A semiconductor nonvolatile RAM according to claim 1, wherein said semiconductor nonvolatile RAM has a store mode for transferring data from said dynamic RAM cell to said $E^2PROM$ cell and a recall mode for transferring data from said $E^2PROM$ cell to said dynamic RAM cell;

wherein, in the store mode, when said storage region is charged in accordance with data "1" stored in said dynamic RAM cell, electrons are injected into said floating gate from said source region and said electrons injected into said floating gate are trapped in said floating gate; and when said storage region is noncharged in accordance with data "0" stored in said dynamic RAM cell, electrons are emitted from said floating gate to said source region; and wherein, in the recall mode, when electrons are trapped in said floating gate, said storage region is charged by said electrons and said charge of said storage region is maintained, whereby said first part of said channel region of said second transistor is rendered nonconductive; and when electrons are emitted from said floating gate, said charges in said storage region are discharged to said source region through said channel region of said $E^2PROM$ cell, whereby said first and second parts of said channel region of said second transistor are rendered conductive.

4. A semiconductor nonvolatile RAM comprising:

a dynamic RAM cell comprising a first transistor and a storage node for storing data, said first transistor including first and second diffusion layers, a channel region provided therebetween, and a gate located above the channel region and insulated therefrom, and said first diffusion layer, said gate, and said second diffusion layer connected to a bit line, a word line, and one end of said storage node, respectively; and an $E^2PROM$ cell comprising a second transistor including the second diffusion layer of said first transistor, a third diffusion layer thereof, a channel region located between said second and third diffusion layers, said channel region located between said second and third diffusion layers including first and second portions, and a floating gate located above said third diffusion layer and said first portion of said channel region and insulated from said third diffusion layer by a tunnel oxidation film, said storage node located above said floating gate and said second portion of said channel region, and a control gate located above said storage node, said control gate and said storage node comprising a capacitor of said dynamic RAM cell, wherein said second portion of said channel region is rendered conductive when one logic data is stored in said storage node, said second portion of said channel region is rendered nonconductive when other logic data is stored in said storage node.

5. A semiconductor nonvolatile RAM according to claim 4, wherein said semiconductor nonvolatile RAM has a store mode for transferring data from said dynamic RAM cell to said $E^2PROM$ cell and a recall mode for transferring data from said $E^2PROM$ cell to said dynamic RAM cell;

wherein, in the store mode, when said storage node is charged in accordance with data "1" stored in said dynamic RAM cell, electrons are injected into said floating gate from said third diffusion layer and said electrons injected into said floating gate are trapped in said floating gate; and when said storage node is noncharged in accordance with data "0" stored in said dynamic RAM cell, electrons are emitted from said floating gate to said third diffusion layer; and wherein, in the recall mode, when electrons are trapped in said floating gate, said storage node is charged by said electrons and said charge of said storage node is maintained, whereby said first portion of said channel region of said second transistor is rendered nonconductive; and when electrons are emitted from said floating gate said charge of said storage node is discharged to said third diffusion layer through said channel region of said $E^2PROM$ cell, whereby said first and second portions of said channel region of said second transistor are rendered conductive.

6. A semiconductor nonvolatile RAM comprising:

a dynamic RAM cell comprising a first transistor and a storage node serving as a capacitor, said first transistor including a drain, source and gate, connected to a bit line, an end of said storage node, and a word line, respectively; and an $E^2PROM$ cell comprising a second transistor including a source connected to a power source, a drain commonly connected with the source of said first transistor, a channel region located between said drain and source of said second transistor, said channel region having first and second portions, a floating gate located above said first portion of said channel region and said source of said second transistor, and insulated from said source of said second transistor by a tunnel oxidation film, said storage node located above said floating gate and said second portion of said channel region, and a control gate located above said storage node and insulated therefrom, said control gate and said storage node forming said capacitor of said dynamic RAM cell, wherein said second portion of said channel region is rendered conductive when one logic data is stored in said storage node, said second portion of said channel region is rendered nonconductive when other logic data is stored in said storage node, wherein said semiconductor nonvolatile RAM has a store mode for transferring data from said dynamic RAM cell to said $E^2PROM$ cell and a recall mode for transferring data from said $E^2PROM$ cell to said dynamic RAM cell;

wherein, in the store mode, when said storage node is charged in accordance with data "1" stored in said dynamic RAM cell, electrons are injected into said floating gate from said source of said second transistor and said electrons injected into said floating gate are trapped in said floating gate; and when said storage node is noncharged in accordance with data "0" stored in said dynamic RAM cell, electrons are emitted from said floating gate to said source of said second transistor; and wherein, in the recall mode, when electrons are trapped in said floating gate, said storage node is charged by said electrons and said charge at said storage node is maintained, whereby said first portion of said channel region of said second transistor is rendered nonconductive; and when electrons are emitted from said floating gate, said charge of said storage node is discharged to said source of said second transistor through said channel region of said E$^2$PROM cell, whereby said first and second portions of said channel region of said second transistor are rendered conductive.

7. A semiconductor nonvolatile RAM according to claim 6, wherein said E$^2$PROM cell injects electrons from the source to the floating gate while maintaining said control gate at a predetermined potential level higher than a ground potential supplied to the source in said store mode in which data stored in said dynamic RAM cell transfer to said E$^2$PROM cell, ant preserves the electrons injected in the floating gate when data "1" is stored in said storage node.

8. A semiconductor nonvolatile RAM according to claim 6, wherein said E$^2$PROM cell renders the second portion of said channel region of said second transistor conductive in accordance with data stored in said storage node in said recall mode in which data stored in said E$^2$PROM cell is transferred to said dynamic RAM cell, and renders the first portion of said channel region conductive so as to discharge said data stored in said storage node to said source of said second transistor via the channel region which is in a conductive state, when no electrons are injected in the floating gate.

* * * * *

UNITED STATES PATENT AND TRADEMARK OFFICE
CERTIFICATE OF CORRECTION

PATENT NO. : 5,557,566
DATED : September 17, 1996
INVENTOR(S) : Kiyofumi OCHII

It is certified that error appears in the above-indentified patent and that said Letters Patent is hereby corrected as shown below:

Title page, item [54] and column 1:

In the Title, line 2, "E2PROM" should read --$E^2PROM$--.
line 3, "MIDPORTION" should read --MID-PORTION--.

Claim 7, column 10, line 1, "ant" should read --and--.

Signed and Sealed this

Thirteenth Day of May, 1997

Attest:

Attesting Officer

BRUCE LEHMAN

Commissioner of Patents and Trademarks